United States Patent
Zhang et al.

(10) Patent No.: US 7,340,360 B1
(45) Date of Patent: Mar. 4, 2008

(54) METHOD FOR DETERMINING PROJECTED LIFETIME OF SEMICONDUCTOR DEVICES WITH ANALYTICAL EXTENSION OF STRESS VOLTAGE WINDOW BY SCALING OF OXIDE THICKNESS

(75) Inventors: John Zhang, Palo Alto, CA (US); Kurt Taylor, San Jose, CA (US); Eugene Zhao, Ashburn, VA (US); Amit Marathe, Milpitas, CA (US); Rolf Geilenkeuser, Dresden (DE); Joerg-Oliver Weidner, Moritzburg (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 11/349,076

(22) Filed: Feb. 8, 2006

(51) Int. Cl.
*G06F 19/00* (2006.01)
(52) U.S. Cl. ............ 702/81; 702/118; 324/769
(58) Field of Classification Search ........... 702/64, 702/65, 117, 118, 179–182, 81; 257/77; 324/769; 438/281
See application file for complete search history.

(56) References Cited

U.S. PATENT DOCUMENTS

| | | | | |
|---|---|---|---|---|
| 6,049,213 A * | 4/2000 | Abadeer | ............. | 324/719 |
| 6,326,792 B1 * | 12/2001 | Okada | ............. | 324/456 |
| 6,873,932 B1 * | 3/2005 | Kim | ............. | 702/182 |
| 6,972,436 B2 * | 12/2005 | Das et al. | ............. | 257/77 |
| 7,026,217 B1 * | 4/2006 | Kamath et al. | ............. | 438/281 |
| 7,026,838 B2 * | 4/2006 | Reddy et al. | ............. | 324/769 |
| 7,106,088 B2 * | 9/2006 | Tsai et al. | ............. | 324/769 |

* cited by examiner

*Primary Examiner*—John Barlow
*Assistant Examiner*—Douglas N Washburn
(74) *Attorney, Agent, or Firm*—McDermott Will & Emery

(57) ABSTRACT

A method for efficiently and accurately measuring a maximum $V_{cc}$ calculation or failure rate and lifetime projection for microprocessors and other semiconductor products analytically scales low voltages applied to thinner oxides to thicker oxides. The expanded voltage window that is closer to the use voltage is obtained thereby to provide accurate voltage acceleration factors and max $V_{ce}$ extraction.

16 Claims, 2 Drawing Sheets

METHOD FOR DETERMINING PROJECTED LIFETIME OF SEMICONDUCTOR DEVICES WITH ANALYTICAL EXTENSION OF STRESS VOLTAGE WINDOW BY SCALING OF OXIDE THICKNESS

FIELD

The present disclosure relates to the field of semiconductor manufacturing and testing, and more particularly, for methods for maximum Vcc extraction or failure rate and lifetime projection for semiconductor products.

BACKGROUND

Integrated circuits (ICs) are being deployed in large volumes in many different environments. In a typical scenario, a designer generates a design using various software design tools. The design is then used to fabricate potentially a large number of ICs. It is generally desirable that the ICs operate for a long time, at least under their intended operating conditions.

Accordingly, it is typically necessary to analyze the design to determine whether the corresponding ICs are likely to fail over a period of time. Failure rate is a parameter which is used to measure the probability of failure of an integrated circuit over a long period of time. According to certain methodologies for testing, a great number of devices are tested for a relatively short period of time and the number of devices failing is termed as the failure rate. If the failure rate is determined to be unacceptably high, a designer may have an opportunity to redesign the IC to achieve an acceptable failure rate, assuming the same manufacturing process.

A well-known reason for failure of an integrated circuit is the wearout (or degradation in general) of gate oxide contained in transistors, which form the integrated circuits. As is also well-known, gate oxide is commonly used as an insulator in the gate of components such as MOSFETs (metal oxide semi-conductor field effect transistors) and the insulator degrades typically under continuous biases and signal overshoots (in positive and negative directions) at the gate terminal.

An overshoot generally refers to the voltage level of a signal which is in excess of the voltage level defining a corresponding logical level. For example, a logical level of 1 may be represented by 1.5 V and voltage levels exceeding 1.5 V are referred to as overshoots. Similarly, assuming 0 voltage level represents a logical value of 0, excessive negative voltage may also be referred to as undershoot or overshoot (in the negative direction).

One challenge in analyzing such integrated circuits (for determining the failure rate) is that typical integrated circuits contain a large number of transistors and analyzing the possible voltage range of the input signals at each transistor will consume a long period of time. The resulting long analysis times are unacceptable, at least in situations where it is desirable to keep the design cycle time short. To provide for an accurate measurement of the failure rate and lifetime projection (or maximum Vcc) for microprocessors and other semiconductor products, stress voltages are applied to the products. The efficiency and accuracy of the calculation for determination of the failure rate and lifetime projection are dependent on the range of applied stress voltages. A broad range of stress voltages that are close to the actual operational voltage of the circuit provides high accuracy. On the other hand, the use of voltages close to the operating voltage will require a long period of time to determine the failure rate and lifetime projection or maximum Vcc calculation. The relatively short product life cycle of high performance microprocessors, however, demands an efficient qualification with a reasonable time dependent dielectric breakdown (TDDB) test period. Hence, long-term stresses of the semiconductor products at low voltages are not practically favored.

SUMMARY

There is a need for an improvement in the efficiency and accuracy of a maximum Vcc calculation or failure rate and lifetime projection for microprocessors and other semiconductor products.

This and other needs are met by embodiments of methods for determining projected lifetime of semiconductor devices. These methods comprise the steps of measuring times to failure (TTFs) of semiconductor devices having a first gate oxide thickness at a first set of stress voltages. The TTFs of semiconductor devices having a second gate oxide thickness are measured at a second set of stress voltages different than the first set of stress voltages. Theoretical computation is performed to determine TTFs of the semiconductor devices having a first gate oxide at the second set of stress voltages. The lifetime of the semiconductor devices having a first gate oxide are projected at an operating voltage based on the measured TTFs at the first set of stress voltages and the determined TTFs at the second set of stress voltages.

The earlier stated needs are also met by other embodiments which provide a method of extracting maximum Vcc (max Vcc) for semiconductor products having semiconductor devices with a first gate oxide thickness. The method comprises the steps of applying a first range of stress voltages to test structures having a first gate oxide thickness and making breakdown measurements. A second range of stress voltages are applied to test structures having a second gate oxide thickness and breakdown measurements are made. The breakdown measurements for the second gate oxide thickness are scaled to the first gate oxide thickness. The max Vcc for the semiconductor product is determined based on the breakdown measurements for the first structures having the first gate oxide thickness and the scaled breakdown measurements.

The foregoing and other features, aspects and advantages will become more apparent from the following detailed description when taken in conjunction with the accompanying drawings.

DETAILED DESCRIPTION

The embodiments of the invention address concerns relating to the efficiency and accuracy of maximum Vcc calculation or failure rate and lifetime projection for microprocessors and other semiconductor products. In particular, the application of stress voltages to semiconductor products, in which the stress voltages are in a broad range close to the use condition to provide high accuracy, requires a long period of time to determine the failure rate. However, the relatively short product life cycle of high performance microprocessors requires an efficient qualification with a reasonable TDDB test period. Long term stresses at low voltages are not practically favored. According to certain embodiments, these concerns are addressed and solved, at least in part, by analytically scaling low voltages applied to thinner oxides to a thicker oxide actually employed in the semiconductor products. Hence, a broader voltage window that is closer to the use voltage (or the maximum voltage that is allowed across a microprocessor) is obtained. This results in better accuracy for the voltage acceleration and the max Vcc extraction, in a very effective manner.

The voltage acceleration of TDDB (time dependent dielectric breakdown) lifetime is a key factor in the microprocessor max Vcc extraction. Typically, test chips are subjected to highly accelerated stress voltages in order to evaluate the gate oxide's time to failure (TTF, or t63 at 63% failure rate) and to generate a voltage acceleration factor (VAF). From the VAF, along with other factors, a projection is made of the stress voltages to a normal use or operating voltage, or the maximum voltage that is allowed across a microprocessor. There is a practical limitation to this qualification procedure due to the narrow window of high voltages and short TTF's, which result in an inaccurately small scaling factor. By analytically extending the voltage window toward the operation condition without conducting lengthy tests, a more accurate VAF and max VCC is also obtained.

Figure 1:
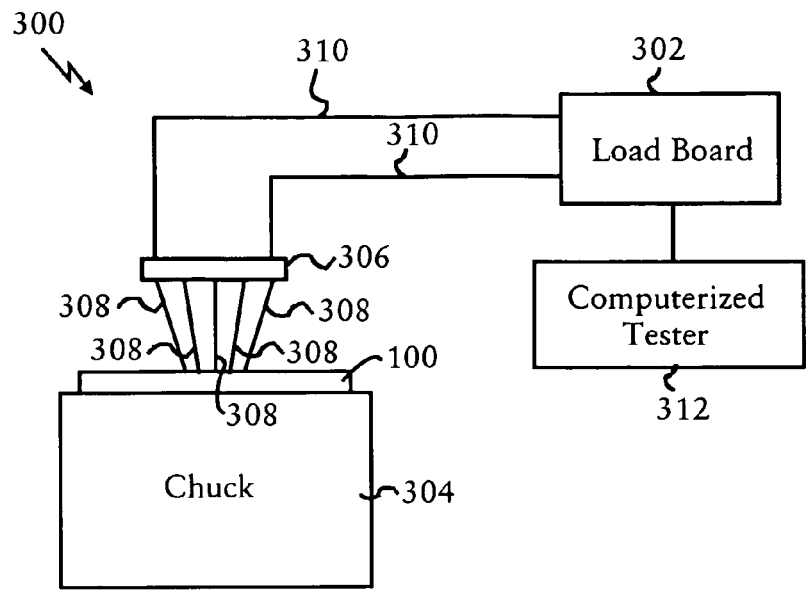
FIG. 1 is a schematic depiction of an exemplary tester for determining the maximum Vcc or failure rate and lifetime projection for microprocessors and other semiconductor products, which may be used to implement embodiments of the disclosed methods.

An exemplary testing apparatus 300 for testing a semiconductor product on a semiconductor wafer 100 in accordance with embodiments is disclosed in FIG. 1. This systematic depiction is exemplary only, as other arrangements for testers may be employed without departing from the scope of the present invention. The testing apparatus 300 includes a load board 302, a socket or probe card 306, a heat sink or thermal chuck 304, a plurality of pins or probes 308, and a computerized tester 312, for a package level system or wafer level system. Disposed on the chuck 304 is the semiconductor wafer 100 for testing. The probes 308 are attached to the probe card 306 and are configured to make electrical contact with a semiconductor test structure or semiconductor device for testing. The probe card 306 is electrically coupled to the load board 302, which directs signals from the tester 312 to the appropriate pins on probe card 306. For example, the load board 302 provides input signals to one or more probes 308 and receives output signals from one or more probes 308.

The tester 312 is coupled to load board 302 to receive measured output signals and provide one or more associated input signals. From these inputs, the tester 312 evaluates the performance of the semiconductor device and can also process failure and reliability data of the semiconductor test structures (not referenced in FIG. 1) on a semiconductor wafer 100 to predict its reliability at the device level. In certain embodiments, the tester 312 is implemented using a processor and a memory for storing data and programs for analyzing failure data.

Figure 2:
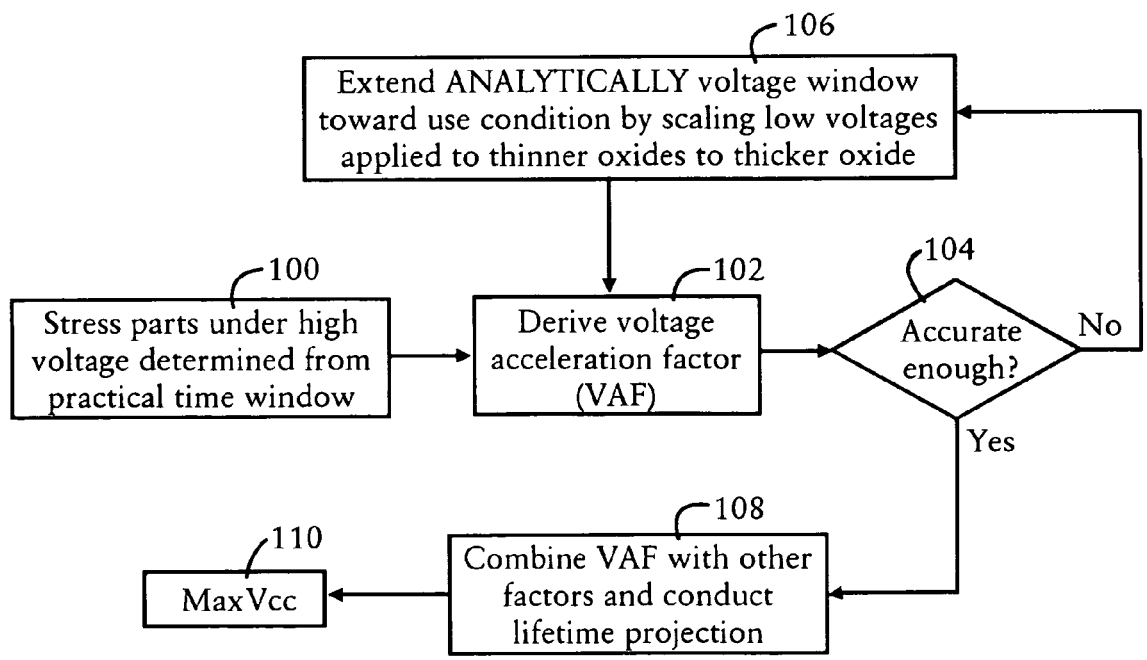
FIG. 2 depicts an exemplary flow chart for extracting maximum Vcc by analytical extension of a stress voltage window in accordance with disclosed embodiments.

FIG. 2 depicts an exemplary flow chart of an embodiment for determining the maximum Vcc calculation or failure rate and lifetime projection for microprocessors and other semiconductor products. In step 100, semiconductor test structures or other devices are stressed under high voltages employing a practical time window. A least square fit and residue analysis, for example, may be employed to determine the accuracy of an exponential VAF determined from the high stress voltages. A conventional methodology may be employed to derive the VAF, depicted in step 102. However, employing such a methodology for stressing parts under high voltages may not provide an accurate enough VAF. This is determined in step 104.

Assuming that it is determined that a more accurate VAF is required, the process proceeds to step 106. In this step, the voltage window is extended analytically toward a use condition by scaling the low voltages applied to thinner oxides to thicker oxides. This will be explained in more detail below. After the analytical extension of the voltage window towards the use condition in step 106, the voltage acceleration factor VAF is derived again in step 102. Assuming now that the VAF is now considered accurate enough in step 104, the VAF is combined with other factors and a lifetime projection is conducted in a manner consistent with known methodologies. This step is performed in step 108. From the lifetime projection determined in step 108, a max Vcc may be determined in step 110 by a conventional method.

Figure 3:
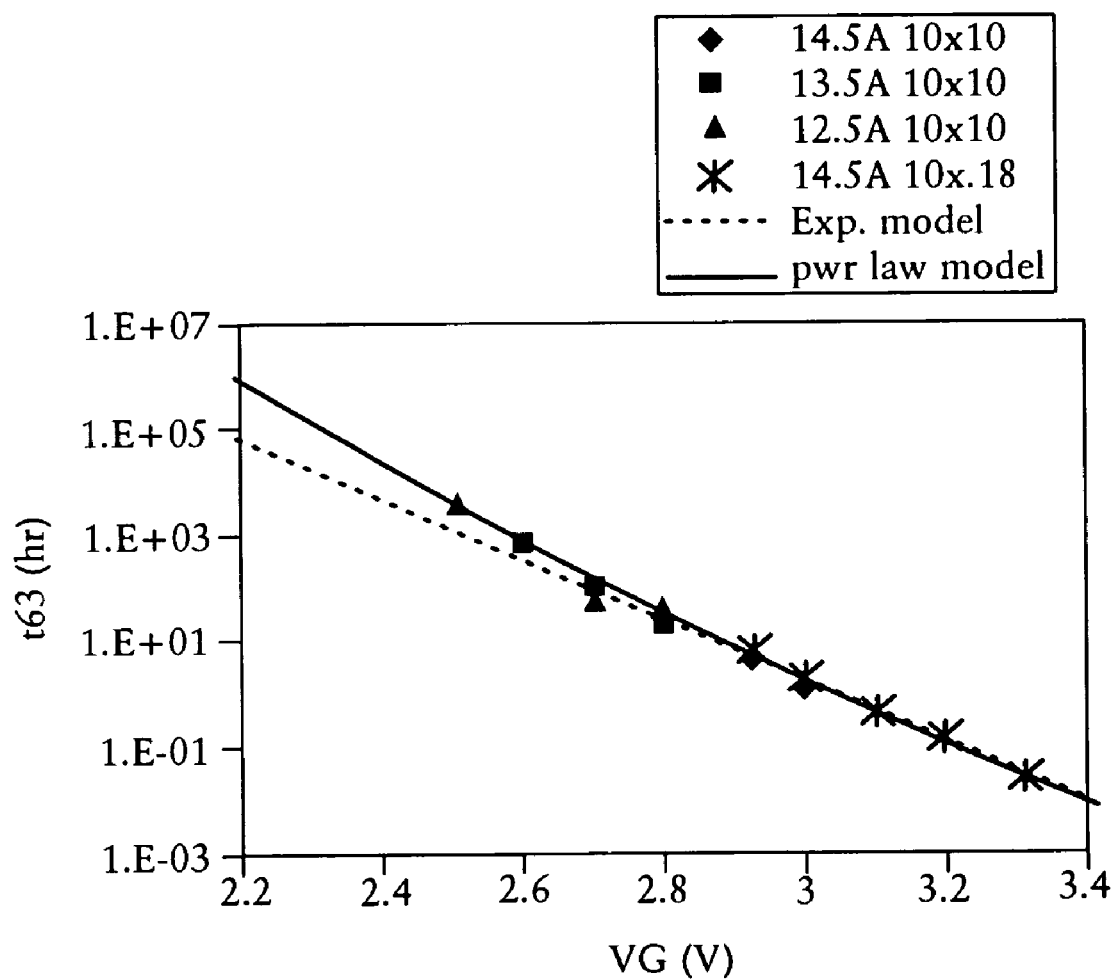
FIG. 3 is an exemplary plot of an extended voltage window and time window for providing a power law voltage acceleration for a TDDB lifetime projection in accordance with certain embodiments.

FIG. 3 depicts exemplary plots of data obtained for different oxide thicknesses and help to illustrate some inventive aspects of the disclosed embodiments. In the following description, it should be apparent that the parameters and values employed are exemplary only, as the embodiments described herein are generally applicable.

The stress voltages that can be applied to thicker oxides are relatively high voltage, and not relatively close to the operating voltage. For example, stress voltages applied to an oxide of 14.5 Å are depicted in FIG. 3. Two different sets of measurements are shown after normalization, representing different size structures being tested having 14.5 Å thick oxides. The larger structures with 14.5 Å oxides are shown with an "*" mark for their measured values of TTF (or t63). This shows that the voltages are measured at 3.3 volt, 3.2 volt, 3.1 volt, 3.0 volt, and 2.9 volt. For a smaller structure, again with a 14.5 Å oxide thickness, the measured values for TTF are depicted by diamonds in FIG. 3. Measurements are taken at 3.1 volt, 3.0 volt, and 2.9 volts 9. The voltage range is therefore roughly between 3.3 volts and 2.9 volts. The TTF window is essentially 3 decades.

Assuming that the operating voltage of the semiconductor product is approximately 1.0 to 1.5 volts, the relatively limited voltage window and TTF window provided with a 14.5 Å measurements lead to an inaccurate projection of the TTF at the operating voltage. The exponential model, as shown in dashed lines, will provide an inaccurate projection based upon these numbers and values for a semiconductor product having a 14.5 Å thickness. Hence, the present invention provides an analytical scaling of the low voltages applied to thinner oxides to a thicker oxide. This produces a broader voltage window that is closer to the use voltage and thereby results in better accuracy for the voltage acceleration factor and the max Vcc extraction.

The analytical extension depicted in FIG. 2, step 106, employs a physics-based analytical approach to thin-oxide breakdown statistics. A physics-based, percolation-like defect theory that can be employed in the disclosed embodiments is described in "*New Physics-Based Analytic*

Approach To The Thin-Oxide Breakdown Statistics," J. Sune, IEEE Electron Dev. Lett., 22(6), 296, 2001.

Thinner oxides are tested and stressed by stress voltages in certain embodiments. In FIG. 3, stress voltages are applied to test structures having a 13.5 Å oxide thickness and results are measured, with the data points being depicted by squares in FIG. 3. Similarly, the measurement results for test structures having a 12.5 Å gate oxide thickness are depicted by triangles in FIG. 3. The measurements made for the 13.5 Å thickness are done at stress voltages of 3.0 volts, 2.9 volts, 2.8 volts, 2.7 volts and 2.6 volts. Similarly, the measurements made of the test structures with gate oxide thicknesses of 12.5 Å are made at 2.9 volts, 2.8 volts, 2.7 volts, 2.6 volts and 2.5 volts.

The power law model, depicted as a solid line, shows that the measured TTF (t63) deviates significantly when the measurements for the thinner oxides are taken into account. If only the values for the thicker oxide were used, an inaccurate projection would therefore result. With the disclosed embodiments, a voltage window for making the measurements that are used in the projection to the operating voltage and determining the lifetime at the operating voltage is extended from 0.5 volts to 1.0 volts. Similarly, the TTF window is extended from 3 decades to 6 decades. The accuracy in predicting the projected lifetime, failure rate and max Vcc therefore improves considerably. This is achieved, however, without having to stress the test structures for excessive periods of time, which would hamper the goal of an efficient qualification within a reasonable TDDB test period.

In order to scale the oxide thickness, a Weibull slope distribution for oxide is employed and a charge to breakdown (Qbd) computation is performed for all oxides. The Qbds are then scaled from the thinner oxides to the thicker oxide according to the analytic approach, such as that described by Sune. Once the Qbd measurements are obtained, the scaled Qbds are transformed to TTFs.

The present invention improves the efficiency and accuracy of maximum Vcc calculation or failure rate and lifetime projection for microprocessors and other semiconductor products. Analytically scaling the low voltages applied to thinner oxides to thicker oxides allows a broader voltage window to be employed that is closer to the use voltage and thereby results in improved accuracy and voltage acceleration and max Vcc extraction.

Although the presently described embodiments have been described and illustrated in detail, it is to be clearly understood that the same is by way of illustration and example only and is not to be taken by way of limitation, the scope being limited only by the terms of the appended claims.

What is claimed is:

1. A method of determining projected lifetime of semiconductor devices, comprising the steps:
    measuring times to failure (TTFs) of semiconductor devices having a first gate oxide thickness at a first set of stress voltages;
    measuring TTFs of semiconductor devices having a second gate oxide thickness at a second set of stress voltages different than the first set of stress voltages;
    extrapolating to determine TTFs of the semiconductor devices having a first gate oxide thickness at the second set of stress voltages; and
    projecting the lifetime of the semiconductor devices having a first gate oxide thickness at an operating voltage based on the measured TTFs at the first set of stress voltages and the determined TTFs at the second set of stress voltages.

2. The method of claim 1, wherein the first gate oxide thickness is greater than the second gate oxide thickness.

3. The method of claim 2, wherein the first set of stress voltages include at least some stress voltages greater than all of the stress voltages in the second set of stress voltages and the second set of stress voltages includes at least some stress voltages lower than all of the stress voltages in the first set of stress voltages.

4. The method of claim 3, wherein the operating voltage is lower than all of the stress voltages in the second set of stress voltages.

5. The method of claim 4, wherein the steps of measuring TTFs includes determining charge to breakdown values (Qbds) for the first gate oxide thickness and for the second gate oxide thickness.

6. The method of claim 5, wherein the step of extrapolating includes analytically scaling the Qbds from the second gate oxide thickness to the first gate oxide thickness.

7. The method of claim 6, further comprising transforming the Qbds and the scaled Qbds to TTFs.

8. A method of extracting maximum Vcc (max Vcc) for semiconductor products having semiconductor devices with a first gate oxide thickness, comprising the steps:
    applying a first range of stress voltages to test structures having a first gate oxide thickness and making breakdown measurements;
    applying a second range of stress voltages to test structures having a second gate oxide thickness and making breakdown measurements;
    scaling the breakdown measurements for the second gate oxide thickness to the first gate oxide thickness; and
    determining the max Vcc for the semiconductor products based on the breakdown measurements for the test structures having the first gate oxide thickness and the scaled breakdown measurements.

9. The method of claim 8, wherein the breakdown measurements are charge to breakdown values (Qbds).

10. The method of claim 8, wherein the first gate oxide thickness is greater than the second gate oxide thickness.

11. The method of claim 10, wherein the first range of stress voltages includes stress voltage values higher than all of the stress voltage values in the second range of stress voltages; and
    the second range of stress voltages includes stress voltage values lower than all of the stress voltage values in the first range of stress voltages.

12. The method of claim 11, wherein the step of determining the max Vcc includes transforming the breakdown measurements to time to failure measurements (TTFs).

13. The method of claim 12, wherein the step of determining the max Vcc includes projecting the TTFs for the test structures having a first gate oxide thickness based on the TTFs transferred from the scaled breakdown measurements and the TTFs transformed from the breakdown measurements of the test structures having a first gate oxide thickness to an operating voltage.

14. The method of claim 13, wherein the operating voltage is less than all of the stress voltage values in the second range of stress voltages.

15. The method of claim 14, wherein the breakdown measurements are charge to breakdown values (Qbds).

16. The method of claim 15, wherein the max Vcc is determined from the projected TTFs combined with the measured TTFs.

* * * * *